United States Patent
Okanobu

(10) Patent No.: US 6,904,103 B2
(45) Date of Patent: Jun. 7, 2005

(54) RECEIVING DEVICE AND INTEGRATED CIRCUIT FOR RECEPTION

(75) Inventor: Taiwa Okanobu, Tokyo (JP)

(73) Assignee: Sony Corporation, Tokyo (JP)

(*) Notice: Subject to any disclaimer, the term of this patent is extended or adjusted under 35 U.S.C. 154(b) by 847 days.

(21) Appl. No.: 09/921,243

(22) Filed: Aug. 2, 2001

(65) Prior Publication Data

US 2002/0021769 A1 Feb. 21, 2002

(30) Foreign Application Priority Data

Aug. 4, 2000 (JP) .................................. P2000-236637

(51) Int. Cl.[7] .......................................... H04L 27/06
(52) U.S. Cl. ..................................................... 375/316
(58) Field of Search ................................ 375/316, 340, 375/354, 371, 377; 455/39, 130, 67.11, 67.16, 230, 227

(56) References Cited

U.S. PATENT DOCUMENTS

| | | | |
|---|---|---|---|
| 4,803,700 A | 2/1989 | Dewey et al. ................ | 375/77 |
| 6,002,359 A | 12/1999 | Chen .......................... | 342/352 |
| 6,018,553 A | 1/2000 | Sanielevici et al. ......... | 375/334 |
| 6,081,697 A | 6/2000 | Haartsen .................... | 455/109 |

OTHER PUBLICATIONS

Razavi, B.: "A 900–MHz/1.8–GHz CMOS transmitter for dual–band applications" VLSI Circuits, 1998. Digest of Technical Papers. 1998 Symposium on Honolulu, HI, USA Jun. 11–13, 1998, New York, NY, USA, IEEE, US, oages 128–131, XP010291264.

Primary Examiner—Tesfaldet Bocure
Assistant Examiner—Pankaj Kumar
(74) Attorney, Agent, or Firm—Jay H. Maioli

(57) ABSTRACT

In order to improve various characteristics of a receiving circuit for digital radio services, circuits are provided for forming two local oscillation signals, whose frequencies are both the center frequency between a first ensemble and a second ensemble, and whose phases differ by 90° from each other. Furthermore, there are provided mixer circuits for frequency-converting the received signal into intermediate frequency signals in accordance with the local oscillation signals, phase-shift circuits to which the intermediate frequency signals are supplied, and an addition/subtraction circuit for performing one of addition and subtraction of the outputs of the phase-shift circuits. In addition, there are provided intermediate frequency filters to which the output signal of the addition/subtraction circuit is supplied and demodulation circuits to which the output signals of the intermediate frequency filters are supplied. By switching the process in the addition/subtraction circuit to addition or subtraction, the signals of the first ensemble and the second ensemble are selectively extracted from the demodulation circuits.

17 Claims, 8 Drawing Sheets

RECEIVING DEVICE AND INTEGRATED CIRCUIT FOR RECEPTION

BACKGROUND OF THE INVENTION

1. Field of the Invention

The present invention relates to a receiving device and an integrated circuit for reception.

2. Description of the Related Art

Digital audio radio services in the U.S. are called "DARS", and in DARS, satellite waves and terrestrial waves are used in combination so that even a receiver mounted in a mobile unit such as vehicle can reliably receive the radio waves.

More specifically, in the DARS, a 2.3 GHz band is used, and as shown in part B of FIG. 6, two services are broadcast. Currently, each of the services uses a frequency band of 12.5 MHz. As is also shown in part A of FIG. 6, one service is formed of two ensembles A and B, and each of these ensembles A and B provides 50 channels of programs contents. Therefore, one service provides programs of 100 channels.

The ensemble A is broadcast with individual signals A1, A2, and A3, and the ensemble B is broadcast with individual signals B1, B2, and B3. That is, the contents of the signals A1, A2, and A3 are the same, and the contents of the signals B1, B2, and B3 are the same. Therefore, if any one of the signals A1, A2, and A3 can be received, the program of the ensemble A can be listened to, and in a similar manner, if any one of the signals B1, B2, and B3 can be received, the program of the ensemble B can be listened to.

As is also shown in part A of FIG. 6, the signals A1 to A3 and B1 to B3 are arranged as the signals A1, A2, A3, B3, B2, and B1 in order of frequency, and the signals A1, A2, and A3, and the signals B3, B2, and B1 are symmetrically placed about a center frequency fC between the signal A3 and the signal B3.

The signals A1, A2, B1, and B2 are QPSK (Quadrature Phase Shift Keying) signals. The signals A1 and B1 are transmitted from a broadcasting satellite BS1 over the Western U.S., and the signals A2 and B2 are transmitted from a broadcasting satellite BS2 over the Eastern U.S. (strictly speaking, the satellites BS1 and BS2 are positioned along the Equator at longitudes corresponding to the Western U.S. and the Eastern U.S.). Also, the signals A3 and B3 are OFDM (Orthogonal Frequency Division Multiplex) signals and are transmitted from an antenna on the ground.

Therefore, since the signals A1, A2, B1, and B2 are satellite waves, and a diversity effect can be obtained by the satellites BS1 and BS2, a broadcast can be listened to over the entire U.S. Also, when there is a high-rise building, radio waves are sometimes blocked, but this is compensated for by the signals A3 and B3 of the terrestrial waves. Therefore, even when the receiving conditions of radio waves of a receiver mounted in a vehicle greatly change as the vehicle travels, it is possible to satisfactorily receive a broadcast.

In DARS, since the signals A1 to A3 and B1 to B3 are broadcast by frequency division in the above-described manner, a receiver therefor is constructed as shown in, for example, FIG. 7. In the following description, for brevity of explanation, as shown in FIG. 8A, the signals A1 and A2 are collectively denoted as A12, and the signals B1 and B2 are collectively denoted as B12.

More specifically, in FIG. 7, the signals A12, A3, B12, and B3 are received by an antenna 11, and the received signals A12 to B3 are supplied to a first mixer circuit 14 via a band-pass filter 12 and a high-frequency amplifier 13. Furthermore, a first local oscillation signal SLO is supplied from a first local oscillation circuit 15 to the first mixer circuit 14, whereby the signals A12 to B3 are frequency-converted into first intermediate frequency signals.

When the ensemble A is to be listened to (when the signals A1 to A3 are subjects to be received), as indicated by the solid line in FIG. 8A, the first local oscillation signal SLO is set to a predetermined frequency fL which is lower than those of the signals A12 and A3. Therefore, as shown in FIG. 8B, the signal A12 is frequency-converted into a first intermediate frequency signal SIF12 (at intermediate frequency fIF12), the signal A3 is frequency-converted into a first intermediate frequency signal SIF3 (at intermediate frequency fIF3), and the signals B12 and B3 are frequency-converted into first intermediate frequency signals SIF45 and SIF6, respectively.

When the image rejection characteristics are taken into consideration, the first intermediate frequencies fIF12 and fIF3 cannot be decreased too much, and since a frequency band of 2.3 GHz is used in a broadcast, the first intermediate frequencies fIF12 and fIF3 are set to 100 MHz or higher. For example, the following are set:

fIF12 is approximately 113 MHz, and fIF3 is approximately 116 MHz

Also, when the ensemble B is to be listened to (when the signals B1 to B3 are subjects to be received), as indicated by the broken line in FIG. 8A, the first local oscillation signal SLO is set to a predetermined frequency fH which is higher than those of the signals B12 and B3. Therefore, as shown in FIG. 8C, the signal B12 is frequency-converted into a first intermediate frequency signal SIF12 (at intermediate frequency fIF12), the signal B3 is frequency-converted into a first intermediate frequency signal SIF3 (at intermediate frequency fIF3), and the signals A12 and A3 are frequency-converted into first intermediate frequency signals SIF45 and SIF6, respectively.

Therefore, when any one of the ensembles A and B is to be listened to, the intermediate frequency signals SIF12 to SIF6 are supplied to a band-pass filter 21L for a first intermediate frequency filter, whereby an intermediate frequency signal SIF12 is extracted. Then, this signal is supplied to a second mixer circuit 22L, a second local oscillation signal having a predetermined frequency is provided from a second local oscillation circuit 23, and this signal is supplied to the mixer circuit 22L, whereby the signal SIF12 is frequency-converted into a second intermediate frequency signal. Then, this signal is supplied to a demodulation circuit 25L via a variable gain amplifier 24L for AGC (Automatic Gain Control), whereby a digital audio signal of the target program is demodulated, and this signal is supplied to a selecting/combining circuit 26.

Also, the signals SIF12 to SIF6 from the first mixer circuit 14 is supplied to a band-pass filter 21H for a first intermediate frequency filter, whereby the intermediate frequency signal SIF3 is extracted. Then, this signal is supplied to a second mixer circuit 22H, and furthermore, a second local oscillation signal from the second local oscillation circuit 23 is supplied to the mixer circuit 22H, whereby the signal SIF3 is frequency-converted into a second intermediate frequency signal. Then, this signal is supplied to a demodulation circuit 25H via a variable gain amplifier 24H for AGC, whereby a digital audio signal of the target program is demodulated, and this signal is supplied to the selecting/combining circuit 26.

Then, in the selecting/combining circuit 26, the signal from the demodulation circuit 25L and the signal from the demodulation circuit 25H are selected or combined, and is output at an output terminal 27.

Therefore, as a result of switching the frequency of the first local oscillation signal SLO to a frequency fL or a frequency fH, a digital signal of the ensemble A or a digital signal of the ensemble B is output at the terminal 27.

Then, at that time, when the ensemble A is received, since the digital signal demodulated from the received signal A12 and the digital signal demodulated from the received signal A3 are selected or combined, and is taken out at the terminal 27, a digital signal having a small amount of error can be obtained regardless of the receiving conditions. Furthermore, also when the ensemble B is received, a digital signal having a small amount of error can be obtained regardless of the receiving conditions for the same reasons.

However, in the above-described receiver, when the ensemble is switched from the ensemble A to the ensemble B, it is necessary to change the frequency of the first local oscillation signal SLO from the frequency fL to the frequency fH. That is, as is also clear from FIGS. 8A to 8C, it is necessary to change the frequency of the first local oscillation signal SLO to a frequency larger than the occupied bandwidth 12.5 MHz of the services of the signals A1 to A3 and B1 to B3. Also, the same applies to a case in which the ensemble is changed from the ensemble B to the ensemble A.

The amount of change of this frequency is equal to or more than 10% of the frequencies fL and fH. Moreover, when the first local oscillation circuit 15 is formed by a PLL (Phase-Locked Loop), it is necessary to allow for some margin with respect to the range of change of the oscillation frequency of the VCO (Voltage Controlled Oscillator) of the PLL. For this reason, it is necessary to increase the range of change of the oscillation frequency of the VCO by making the resonance device of the VCO changeable. As a result, the construction becomes complex, and the phase noise characteristics of the local oscillation signal SLO deteriorate, causing the error rate of the digital signal to become worse.

Also, as long as the first local oscillation circuit 15 is formed by a PLL, it takes time to change the frequency, and the ensemble cannot be received during that change.

In addition, the first intermediate frequencies fIF12 and fIF3 are increased to 100 MHz or higher in the above-described manner, and as shown in FIGS. 8B and 8C, it is necessary for the filters 21L and 21H to extract the first intermediate frequency signals SIF12 and SIF3 from within the crowded signals. As a result, the filters 21L and 21H are formed by an SAW (Surface Acoustic Wave) filter. For this reason, the cost increases, and when the circuit is formed into an IC (integrated circuit), the SAW filter must be provided externally. Furthermore, this becomes an obstacle to the reduction in size of the receiver.

Also, when the demodulation of the demodulation circuits 25L and 25H is to be performed by a digital process, an intermediate frequency signal supplied to the demodulation circuits 25L and 25H must be formed into a frequency at which a digital process is possible. For this purpose, as is also shown in FIG. 7, for the receiving method, a double conversion method must be used, the construction becomes complex, and the number of parts is increased.

SUMMARY OF THE INVENTION

The present invention aims to solve such problems as those described above.

Accordingly, an object of the present invention is to provide a receiving device comprising: a receiving circuit for receiving a first signal and a second signal which are transmitted at mutually different frequencies; a circuit for forming first and second local oscillation signals, whose frequencies are both the center frequency between the first signal and the second signal, and whose phases differ by 90° from each other: a first mixer circuit for frequency-converting the received signal received by the receiving circuit into a first intermediate frequency signal in accordance with the first local oscillation signal; a second mixer circuit for frequency-converting the received signal received by the receiving circuit into a second intermediate frequency signal in accordance with the second local oscillation signal; a first phase-shift circuit to which the first intermediate frequency signal is supplied; a second phase-shift circuit to which the second intermediate frequency signal is supplied, in which the amount of the phase shift differs by 90° from that of the first phase-shift circuit; and an addition/subtraction circuit for performing one of addition and subtraction between the output signal of the first phase-shift circuit and the output signal of the second phase-shift circuit, wherein, by switching the process in the addition/subtraction circuit to the addition or the subtraction, the intermediate frequency signal corresponding to the first signal or the intermediate frequency signal corresponding to the second signal is selectively extracted from the addition/subtraction circuit.

Therefore, while the local oscillation frequency is being fixed, the first signal or the second signal is selected.

In particular, a receiving device is provided which is suitable for a case in which each of the first and second signals is formed of a signal of a plurality of programs, and the signals of individual programs are transmission programs which are arranged according to frequency symmetrically with respect to the center frequency.

More specifically, when the ensemble is to be switched, since the frequency of the local oscillation signal does not need to be changed, the local oscillation circuit does not become complex. Also, the deterioration of the phase noise characteristics of the local oscillation signal, and the deterioration of the error rate of the digital signal do not occur. Furthermore, when the ensemble is to be switched, the switching can be performed easily at high speed, and the problem where the ensemble cannot be received during the switching, like when the local oscillation frequency is to be changed, does not occur.

Another object of the present invention is to provide a reception integrated circuit which is suitable for constructing the above-described receiving device. According to the integrated circuit of the present invention, in addition to the above-described features, the intermediate-frequency filter can be formed by an active filter, and can be integrally formed into a one-chip IC with other circuits. This is effective in reducing the cost and the size of the receiver. Furthermore, even when demodulation is to be performed by a digital process, a single conversion may be used for the receiving method, the construction becomes simple, and the number of parts is decreased.

The above and further objects, aspects and novel features of the invention will become more fully apparent from the following detailed description when read in conjunction with the accompanying drawings.

DESCRIPTION OF THE PREFERRED EMBODIMENTS

Figure 1:
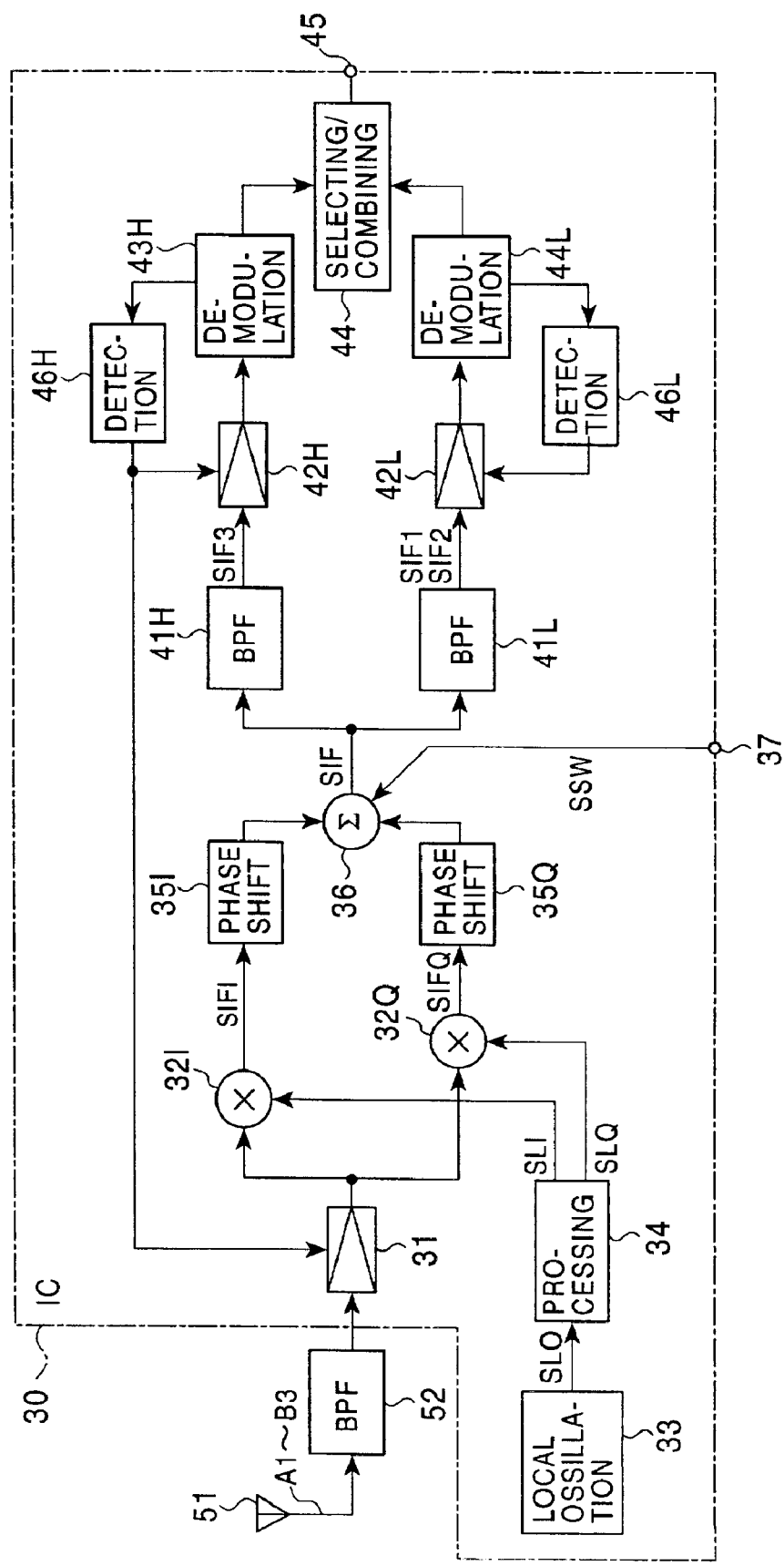
FIG. 1 is a block diagram showing an embodiment of the present invention.

FIG. 1 shows an example of a DARS receiving circuit according to the present invention, in which a portion 30 surrounded by a one-dot chain line is formed into a one-chip IC. Signals A1 to A3, and B1 to B3 are received by an antenna 51, and the received signals A1 to B3 are supplied to mixer circuits 32I and 32Q via a band-pass filter 52, which is formed of, for example, an SAW filter and which has a passing bandwidth of 12.5 MHz and furthermore via a high-frequency amplifier 31.

Figure 2A:
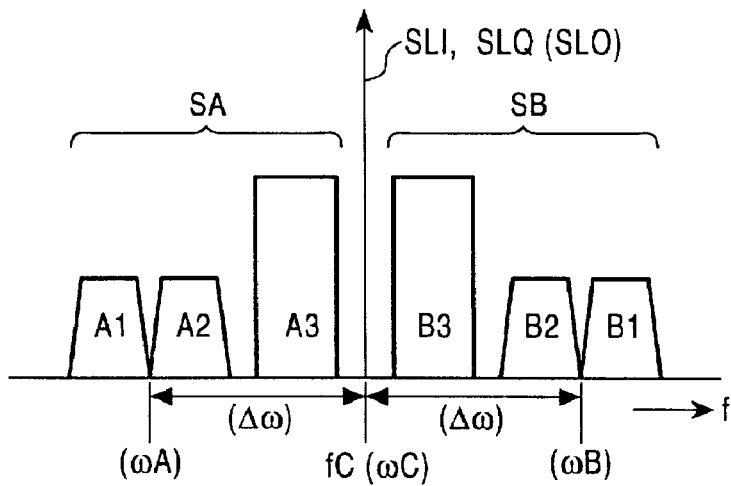
FIGS. 2A, 2B, and 2C are frequency spectrum diagrams illustrating the present invention.

In a local oscillation circuit 33, as shown in FIG. 2A, an oscillation signal SLO having a frequency equal to the center frequency fC between the signal A3 and the signal B3 is formed, this signal SLO is supplied to a phase processing circuit 34, whereby two local oscillation signals SLI and SLQ, whose phases differ by 90° from each other, with the frequency being kept at the value fC, are formed, and these signals SLI and SLQ are supplied to the mixer circuits 32I and 32Q, respectively.

In the following description, for brevity of explanation, it is assumed that, as shown in FIG. 2A, the signal SA represents each of the signals A1 to A3, and the signal SB represents each of the signals B1 to B3. That is, it is assumed that SA=A1, SA=A2, or SA=A3, and that SB=B1, SB=B2, or SB=B3. Then, it is arranged that:

$$SA = EA \cdot \sin \omega A t$$

$$SB = EB \cdot \sin \omega B t$$

where EA is the amplitude of the signal SA, EB is the amplitude of the signal SB, $\omega A$ is the angular frequency of the signal SA, and $\omega B$ is the angular frequency of the signal SB.

Also, it is arranged that:

$$SLI = EL \cdot \sin \omega C t$$

$$SLQ = EL \cdot \cos \omega C t$$

where EL is the amplitude of the signals SLI and SLQ, and $\omega C = 2\pi fC$.

Then, from the mixer circuits 32I and 32Q, signals SIFI and SIFQ as described below are extracted:

$$SIFI = (SA+SB) \times SLI$$

$$= EA \cdot \sin \omega A t \times EL \cdot \sin \omega C t + EB \cdot \sin \omega B t \times EL \cdot \sin \omega C t$$

$$= \alpha \{\cos(\omega A - \omega C)t - \cos(\omega A + \omega C)t\} + \beta \{\cos(\omega B - \omega C)t - \cos(\omega B + \omega C)t\}$$

$$SIFQ = (SA+SB) \times SLQ$$

$$= EA \cdot \sin \omega A t \times EL \cdot \cos \omega C t + EB \cdot \sin \omega B t \times EL \cdot \cos \omega C t$$

$$= \alpha \{\sin(\omega A + \omega C)t + \sin(\omega A - \omega C)t\} + \beta \{\sin(\omega B + \omega C)t + \sin(\omega B - \omega C)t\}$$

where $\alpha = EA \cdot EL/2$, and $\beta = EB \cdot EL/2$

As will be described later, of the signals SIFI and SIFQ, the signal components of angular frequencies ($\omega A - \omega C$) and ($\omega B - \omega C$) are used as the intermediate frequency signals, and the signal components of angular frequencies ($\omega A + \omega C$) and ($\omega B + \omega C$) are removed by the intermediate frequency filter. Therefore, for the sake of simplicity, if the signal components of angular frequencies ($\omega A + \omega C$) and ($\omega B + \omega C$) to be removed are ignored, the above equations become:

$$SIFI = \alpha \cdot \cos(\omega A - C)t + \beta \cdot \cos(\omega B - C)t$$

$$SIFQ = \alpha \cdot \sin(\omega A - C)t + \beta \cdot \sin(\omega B - C)t$$

Here, if it is arranged that $\omega A = \omega C - \Delta \omega$ with regard to the signal SA, since, as is also shown in FIG. 2A, the signal SA and the signal SB are symmetrically distributed about the frequency fC, the following equation holds:

$$\omega B = \omega C + \alpha \omega$$

Then, if these equations are substituted in the equations for the signals SIFI and SIFQ, the following equations are obtained:

$$SIFI = \alpha \cdot \cos(\omega C - \Delta \omega - \omega C)t + \beta \cdot \cos(\omega C + \Delta \omega - \omega C)t$$

$$= \alpha \cdot \cos(-\Delta \omega)t + \beta \cdot \cos \Delta \omega t$$

$$= \alpha \cdot \cos \Delta \omega t + \beta \cdot \cos \Delta \omega t$$

$$SIFQ = \alpha \cdot \sin(\omega C - \Delta \omega - \omega C)t + \beta \cdot \sin(\omega C + \Delta \omega - C)t$$

$$= \alpha \cdot \sin(-\Delta \omega)t + \beta \cdot \sin \Delta \omega t$$

$$= \alpha \cdot \sin \Delta \omega t + \beta \cdot \sin \Delta \omega t$$

These signals SIFI and SIFQ are then supplied to phase-shift circuits 35I and 35Q. The phase-shift circuits 35I and 35Q are formed by an active filter in which, for example, a capacitor, a resistor, and an operational amplifier are used. The phase-shift circuit 35I phase-shifts the signal SIFI by a value $\phi$ ($\phi$ is an arbitrary value), and the phase-shift circuit 35Q phase-shifts the signal SIFQ by a value ($\phi+90°$).

In this manner, the phase-shift circuits 35I and 35Q cause the signal SIFQ to lead the signal SIFI by 90°, and the following equations hold:

$$SIFI = \alpha \cdot \cos \Delta \omega t + \beta \cdot \cos \Delta \omega t$$

$$SIFQ = -\alpha \cdot \sin(\Delta \omega t + 90°) + \beta \cdot \sin(\Delta \omega t + 90°)$$

$$= -\alpha \cdot \cos \Delta \omega t + \beta \cdot \cos \Delta \omega t$$

Therefore, between the signal SIFI and the signal SIFQ, the signal components $\alpha \cdot \cos \Delta \omega t$ are at the opposite phase from each other, and the signal components $\beta \cdot \cos \Delta \omega t$ are in phase.

These signals SIFI and SIFQ are then supplied to an addition/subtraction circuit 36, and a control signal SSW is supplied from a terminal 37 to the addition/subtraction circuit 36. This control signal SSW controls the operation of the addition/subtraction circuit 36 in such a way that when the program of the ensemble A is to be listened to, the addition/subtraction circuit 36 acts as a subtraction circuit, and when the program of the ensemble B is to be listened to, the addition/subtraction circuit 36 acts as an addition circuit.

Therefore, a signal SIF such as that described below is extracted from the addition/subtraction circuit 36 in such a manner as to correspond to the control signal SSW. That is, during subtraction, the following is extracted:

$$SIF=SIFI-SIFQ$$
$$=2\alpha\cos \Delta\omega t$$
$$=EL \cdot EA \cdot \cos \Delta\omega t,$$

and during addition, the following is extracted:

$$SIF=SIFI+SIFQ$$
$$=2\beta \cdot \cos \Delta\omega t$$
$$=EL \cdot EB \cdot \cos \Delta\omega t$$

Figure 2B:
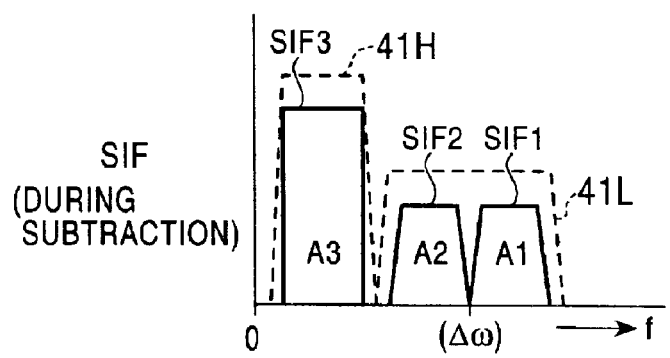
Figure 2C:
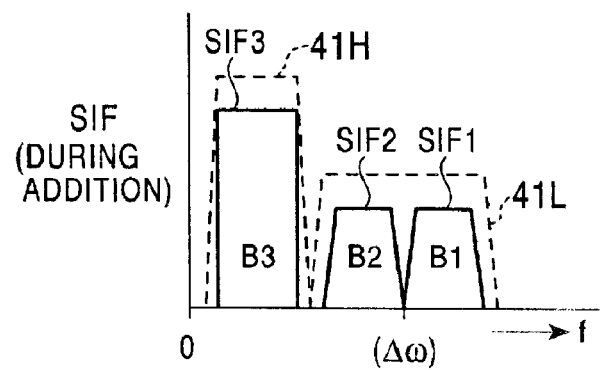

Here, the signal $SIF=EL \cdot EA \cdot \cos \Delta\omega t$ which is obtained during subtraction is, as is also shown in FIG. 2B, the same intermediate frequency signal when the signal SA is received. The signals SIF1 to SIF3 contained in this signal SIF are the intermediate frequency signals of the signals A1 to A3. Also, the signal $SIF=EL \cdot EB \cdot \cos \Delta\omega t$ which is obtained during addition is, as is also shown in FIG. 2C, the same intermediate frequency signal when the signal SB is received. The signals SIF1 to SIF3 contained in this signal SIF are the intermediate frequency signals of the signals B1 to B3.

Therefore, this signal SIF is supplied to a band-pass filter 41H for an intermediate-frequency filter having passing characteristics such as those indicated by the broken line in, for example, FIGS. 2B and 2C, whereby an intermediate frequency signal SIF3 of a terrestrial-wave signal A3 or B3 is extracted. At this time, the intermediate frequency signals SIF1 and SIF2 and the above-mentioned signal components of angular frequencies ($\omega A+\omega C$) and ($\omega B+\omega C$) are removed by the band-pass filter 41H.

Then, this intermediate frequency signal SIF3 is supplied to a demodulation circuit 43H via a variable gain amplifier 42H for AGC, whereby a digital audio signal of the target program is demodulated, and this signal is supplied to a selecting/combining circuit 44.

Also, the signal SIF from the addition/subtraction circuit 36 is supplied to a band-pass filter 41L for an intermediate-frequency filter having passing characteristics such as those indicated by the broken line in, for example, FIGS. 2B and 2C, whereby intermediate frequency signals SIF2 and SIF1 of the satellite-wave signals A1 and A2, or B1 and B2 are extracted. At this time, the intermediate frequency signal SIF3 and the above-mentioned signal components of angular frequencies ($\omega A+\omega C$) and ($\omega B+\omega C$) are removed by the filter 41L.

Then, these intermediate frequency signals SIF2 and SIF1 are supplied to a demodulation circuit 43L via a variable gain amplifier 42L for AGC, whereby a digital audio signal of the target program is demodulated, and this signal is supplied to the selecting/combining circuit 44.

Then, in the selecting/combining circuit 44, the digital signal from the demodulation circuit 43H and the digital signal from the demodulation circuit 43L are selected or combined according to the received status of the signals A1 to B3, and is extracted at an output terminal 45. Of course, when it is desired to give priority to a receiving environment of a mobile unit in which the receiver is mounted and to satellite-wave reception, the AGC voltage obtained from the level detection circuit 46L may be supplied as a gain control signal.

At this time, parts of the intermediate frequency signals from the demodulation circuits 43H and 43L are supplied to level detection circuits 46H and 46L, whereby AGC voltages are formed, and these AGC voltages are supplied, as gain control signals, to the amplifiers 42H and 42L, whereby AGC is performed.

In addition, although the level variation of the satellite wave is relatively small, the level variation of the terrestrial wave is relatively large. Therefore, for the high-frequency amplifier 31, a variable gain amplifier is used, and the AGC voltage obtained from the level detection circuit 46H is supplied, as a gain control signal, to the amplifier 31, whereby AGC is performed.

In this manner, according to the receiving circuit of FIG. 1, a broadcast by DARS can be received, and in a case where the ensemble is switched between the ensemble A and the ensemble B, the frequency fC of the local oscillation signals SLI and SLQ does not need to be changed. Consequently, the local oscillation circuit 33 may be formed in a standard construction and does not become complex. Also, since the phase noise characteristics of the local oscillation signals SLI and SLQ are not decreased, the error rate of the digital signal does not become worse.

In addition, when the ensemble is to be switched, the addition/subtraction circuit 36 need only be switched to an addition operation or a subtraction operation. Consequently, the switching can be performed at high speed, and the problem of not being able to receive the ensemble during switching time does not occur.

As is also clear from FIGS. 2B and 2C, since the upper-limit frequency of the occupied bandwidth of the intermediate frequency signal SIF is equal to a half of the bandwidth of one ensemble, and the center frequencies of the filters 41H and 41L become approximately 1.3 MHz and 4.4 MHz, it is possible to form each of the filters 41H and 41L by an active filter. Therefore, it is possible to form the entirety into a one-chip IC as an IC 30, excluding a band-pass filter 52 at the antenna input stage, and this is effective in reducing the costs and the size of the receiver.

In addition, since the intermediate frequency of the intermediate frequency signals SIF3 to SIF1 is as low as several MHz, even when the demodulation of the demodulation circuits 43H and 43L is performed by a digital process, as shown in, for example, FIG. 1, for the receiving method, a single conversion may be used, the construction becomes simple, and the number of parts is decreased.

Figure 3:
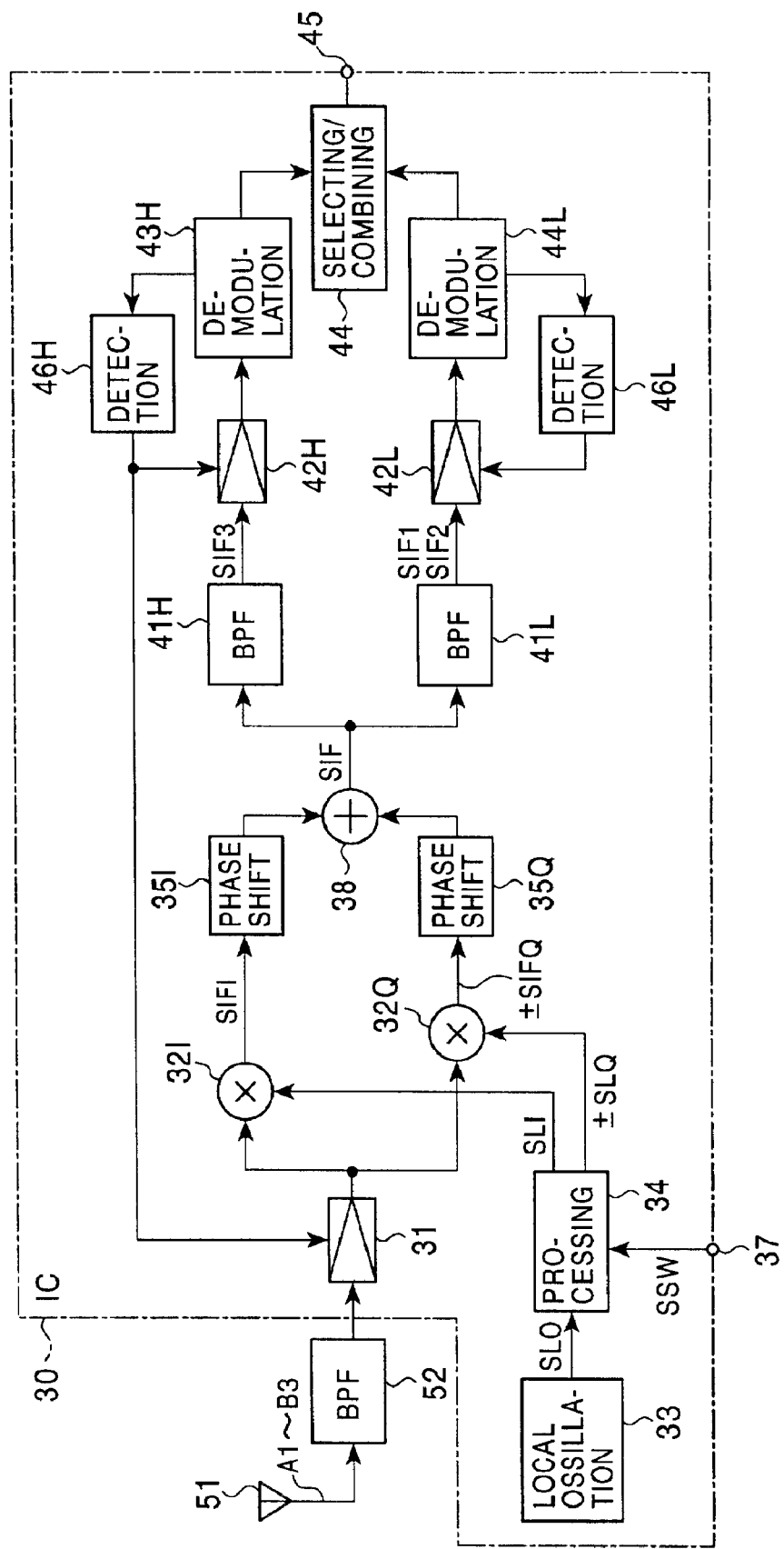
FIG. 3 is a block diagram showing another embodiment of the present invention.

In the receiving circuit shown in FIG. 3, a case is shown in which, by inverting or non-inverting the phase of the local oscillation signal SLQ when the ensemble A is received and when the ensemble B is received, the signals SIFI and SIFQ are always added together.

More specifically, in the receiving circuit in FIG. 3, the control signal SSW is supplied as a phase control signal to the phase processing circuit 34, so that the phase of the local oscillation signal SLQ is controlled such that:

$SLQ=+EL \cdot \cos \omega Ct$ . . . when the ensemble B is received, and $SLQ=-EL \cdot \cos \omega Ct$ . . . when the ensemble A is received. The phase of the local oscillation signal SLI is fixed, as described above:

$SLI=EL \cdot \sin \omega Ct$

In place of the addition/subtraction circuit 36 in FIG. 1, an addition circuit 38 is provided, and the signals SIFI and SIFQ output from the phase-shift circuits 35I and 35Q are supplied to the addition circuit 38.

According to such a construction, in the case of $SLQ=+EL \cdot \cos \omega Ct$, in the addition circuit 38, the signal SIFI and the signal SIFQ are added together. Therefore, as is described with reference to the receiving circuit of FIG. 1, the signal SIF extracted from the addition circuit 38 becomes as follows:

$$SIF = SIFI + SIFQ$$

$$= EL \cdot EB \cdot \cos \Delta\omega t$$

Therefore, it is possible to listen to the program of the ensemble B.

On the other hand, in the case of SLQ=−EL·cos ωCt, the output signal of the phase-shift circuit 35Q becomes the signal −SIFQ. Therefore, since, in the addition circuit 38, subtraction between the signal SIFI and the signal SIFQ is performed, as is described with reference to the receiving circuit of FIG. 1, the signal SIF extracted from the addition circuit 38 becomes:

$$SIF = SIFI - SIFQ$$

$$= EL \cdot EA \cdot \cos \Delta\omega t$$

Therefore, it is possible to listen to the program of the ensemble A.

In this way, also in the receiving circuit of FIG. 3, a DARS broadcast can be received. In particular, according to the receiving circuit of FIG. 3, in a case where the ensemble is switched between the ensemble A and the ensemble B, it is only necessary to invert or non-invert the phase of the local oscillation signal SLQ by the phase processing circuit 34. Therefore, the ensemble can be switched quickly. Also, since the phase-shift circuits 35I and 35Q and the addition circuit 38 can be formed by a poly-phase filter, the phase characteristics of the signal SIFI and the signal ±SIFQ can be improved.

Figure 4:
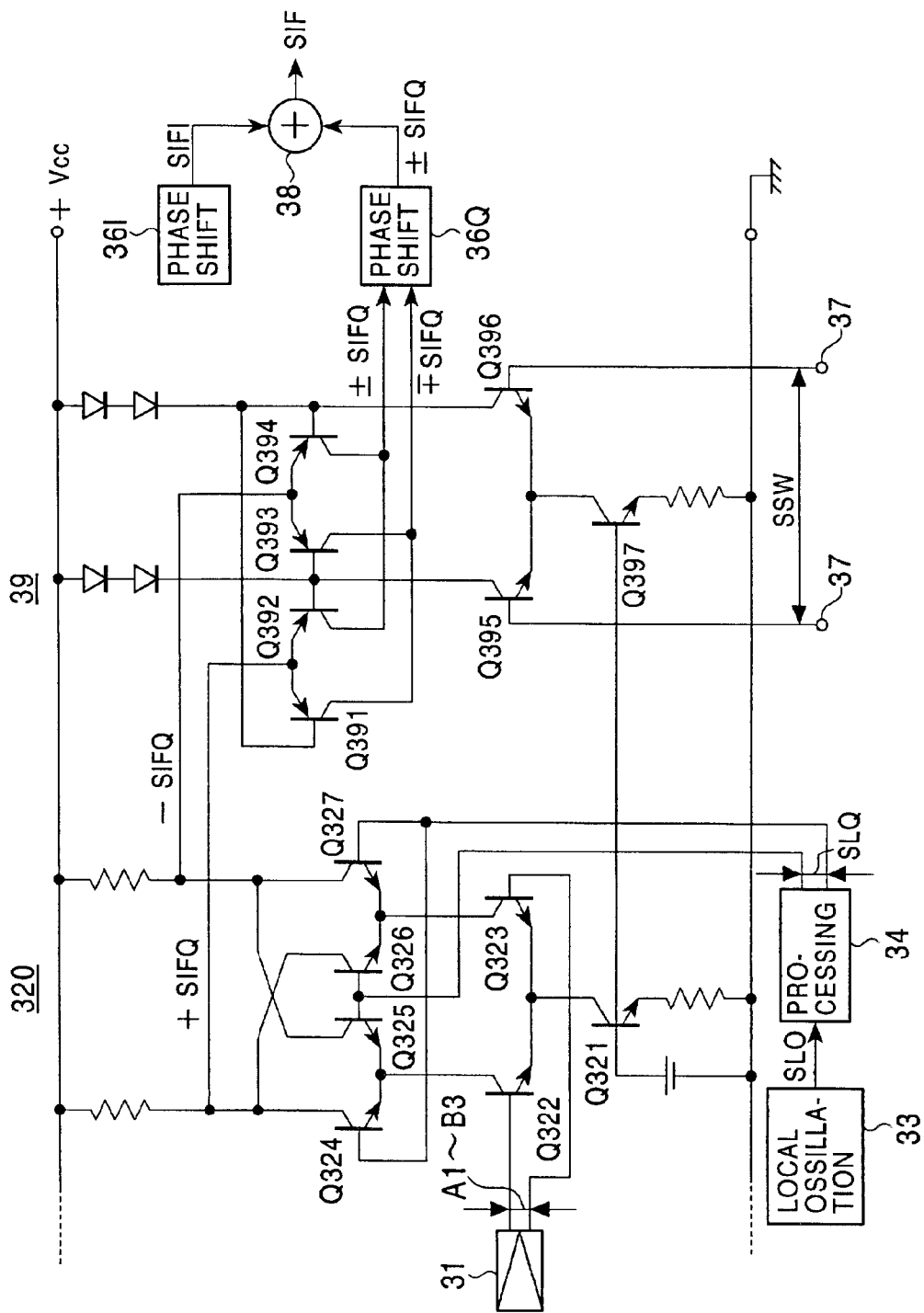
FIG. 4 is a circuit diagram showing a part of the other embodiment of the present invention.

In FIG. 4, a case is shown in which the phase of the intermediate frequency signal SIFI is constant regardless of the ensemble which is received, but the phase of the intermediate frequency signal SIFQ is inverted or non-inverted between when the ensemble A is to be received and when the ensemble B is to be received.

More specifically, the mixer circuit 32Q is formed as a double balanced-type by transistors Q321 to Q327. The received signals A1 to A3 and B1 to B3 are extracted as a balanced type from the amplifier 31 and are supplied to transistors Q322 and Q323. Furthermore, the local oscillation signal SLQ is extracted as a balanced type from the phase processing circuit 34 and is supplied to transistors Q324, Q327, Q325, and Q326.

Consequently, the intermediate frequency signal SIFQ is extracted as a balanced type from the mixer circuit 32Q. That is, for example, the intermediate frequency signal +SIFQ is extracted from the transistors Q324 and Q326, and the intermediate frequency signal −SIFQ is extracted from the transistors Q325 and Q327.

Then, these intermediate frequency signal ±SIFQ are supplied to a switching circuit 39. This switching circuit 39 is formed as a balanced type by transistors Q391 to Q397, and the intermediate frequency signals ±SIFQ which are supplied thereto are supplied to a phase-shift circuit 36Q in accordance with the control signal SSW with the phase kept as it is or with the phase being inverted.

More specifically, based on the control signal SSW, when the transistor Q395 is on and transistor Q396 is off, the transistors Q392 and Q393 are turned on, and the transistors Q391 and Q394 are turned off. Therefore, the intermediate frequency signal +SIFQ extracted from the transistors Q324 and Q326 is supplied to one of the balance input terminals of the phase-shift circuit 36Q via the transistor Q392. Also, the intermediate frequency signal −SIFQ extracted from the transistors Q325 and Q327 is supplied to the other one of the balance input terminals of the phase-shift circuit 36Q via the transistor Q393.

However, based on the control signal SSW, when the transistor Q396 is on and the transistor Q395 is off, the transistors Q391 and Q394 are turned on, and the transistors Q392 and Q393 are turned off. Therefore, the intermediate frequency signal +SIFQ extracted from the transistors Q324 and Q326 is supplied to the other one of the balance input terminals of the phase-shift circuit 36Q via the transistor Q391. Also, the intermediate frequency signal −SIFQ extracted from the transistors Q325 and Q327 is supplied to one of the balance input terminals of the phase-shift circuit 36Q via the transistor Q394.

Therefore, since the phase of the intermediate frequency signal SIFQ supplied to the phase-shift circuit 36Q is inverted or non-inverted in accordance with the control signal SSW, the intermediate frequency signal SIF of the ensemble A or the ensemble B is output from the addition circuit 38. In this case, since the phase of the intermediate frequency signal SIFQ need only be inverted or non-inverted by the switching circuit 39, it is possible to quickly switch the ensemble.

Although the phase of the intermediate frequency signal SIFI is kept fixed, the intermediate frequency signal SIFI output from the mixer circuit 32I may be supplied to a phase-shift circuit 36I via a switching circuit having the same construction as that of the switching circuit 39, and the switching circuit may be kept fixed.

Figure 5:
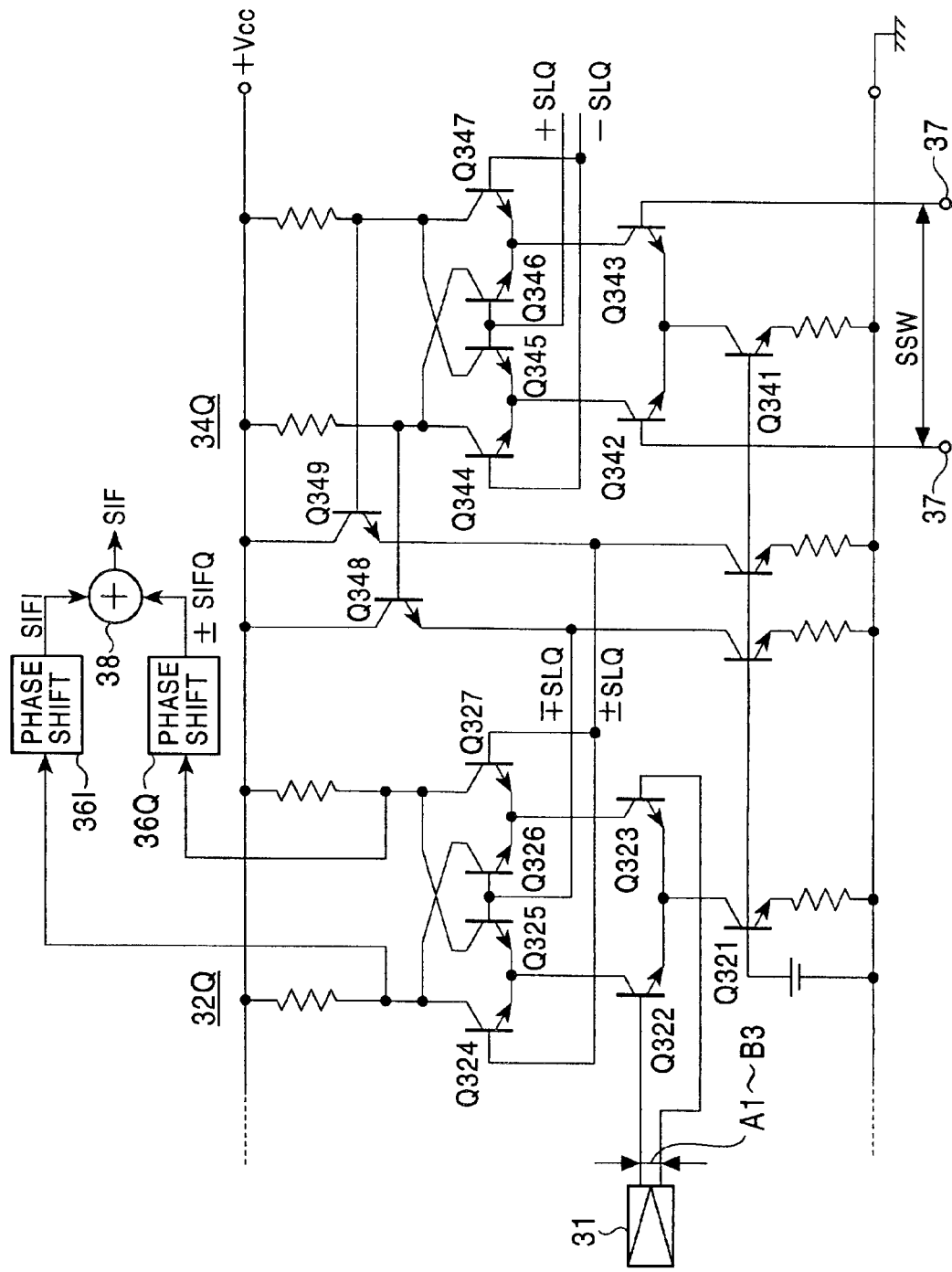
FIG. 5 is a circuit diagram showing a part of the other embodiment of the present invention.
Figure 6:
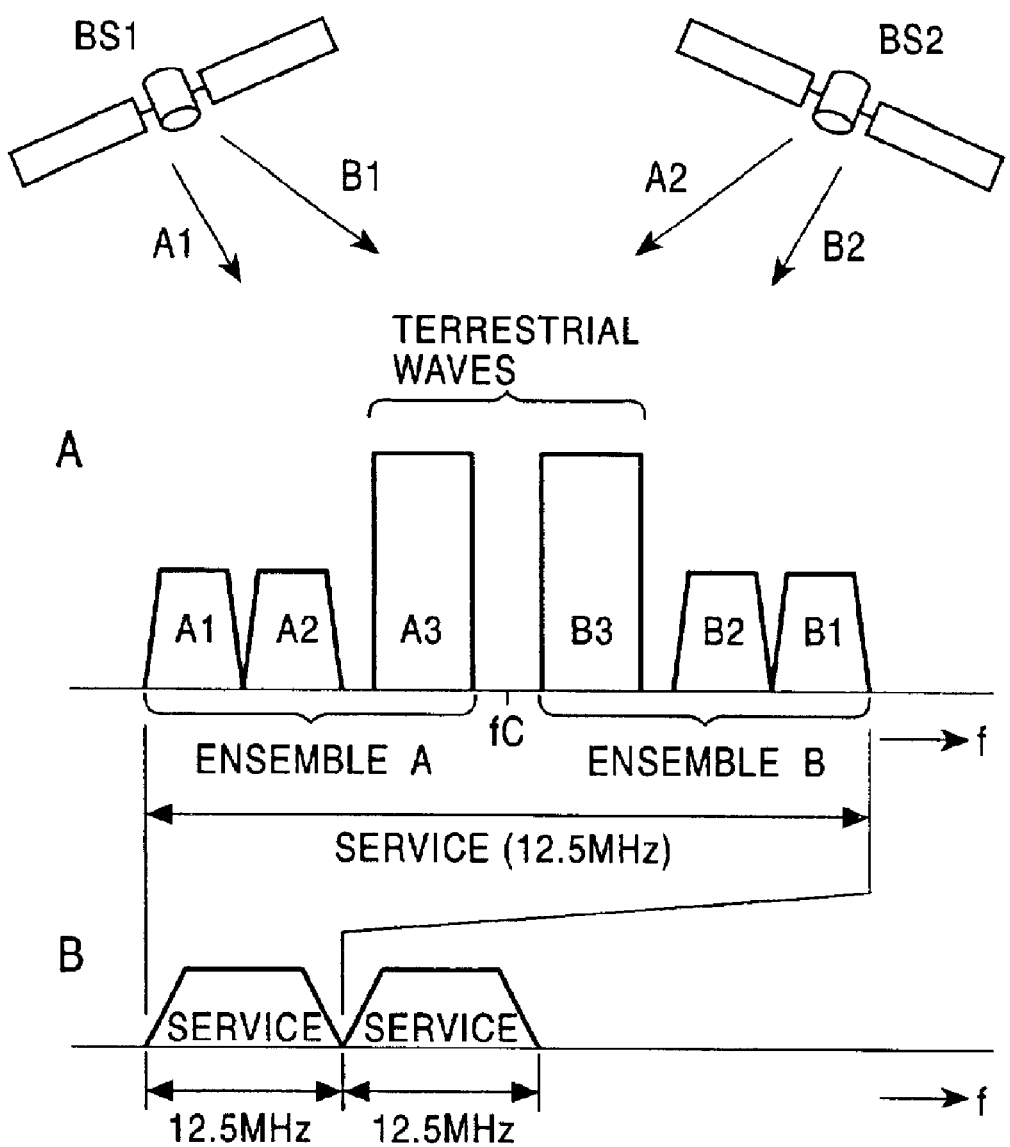
FIG. 6 is a frequency spectrum diagram illustrating DARS.
Figure 7:
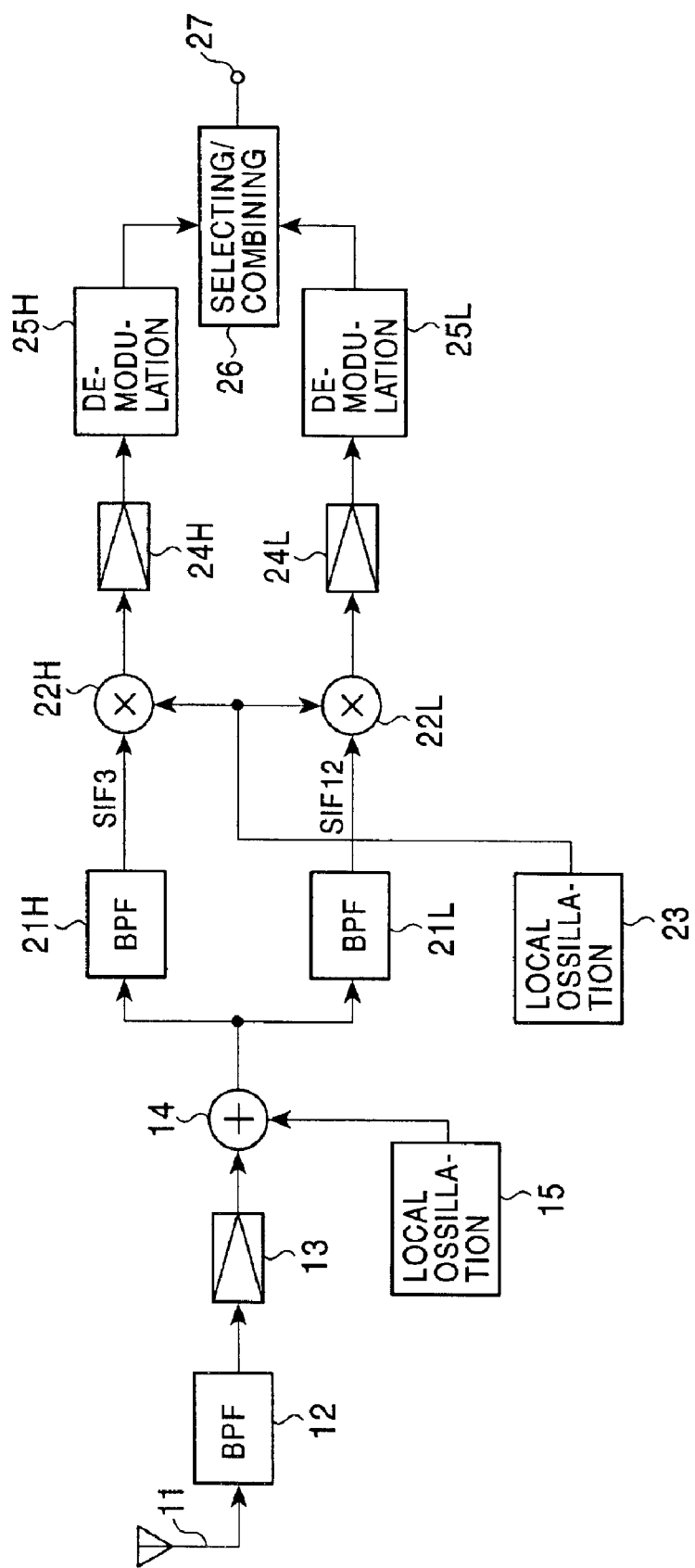
FIG. 7 is a block diagram showing the present invention.
Figure 8A:
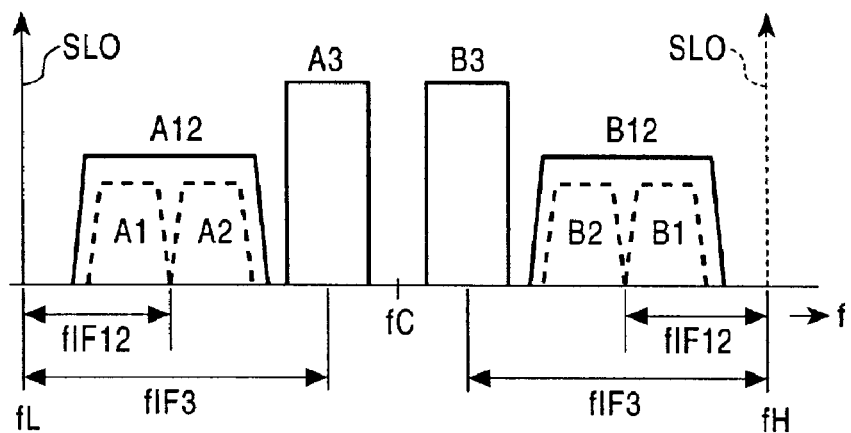
FIGS. 8A, 8B, and 8C are frequency spectrum diagrams illustrating the circuit of FIG. 7.
Figure 8B:
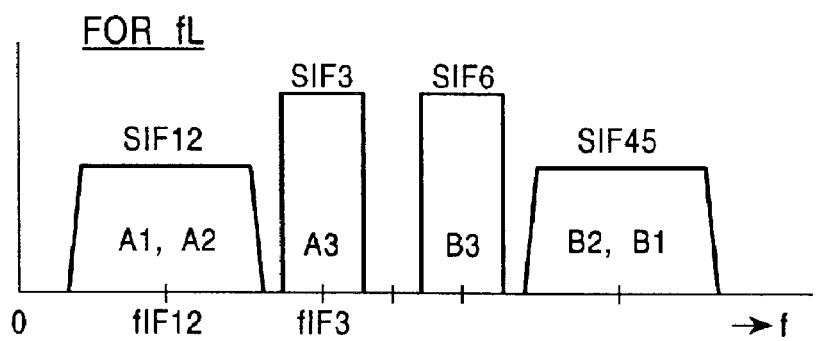
Figure 8C:
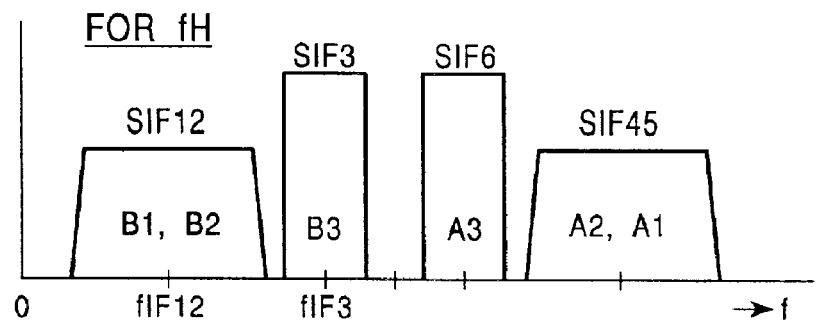

FIG. 5 shows a circuit 34Q of a portion which switches the phase of the local oscillation signal SLQ within the phase processing circuit 34 in FIG. 3. That is, the mixer circuit 32Q is formed as a double balance-type as described in FIG. 4, and the received signals A1 to A3 and B1 to B3 are extracted as a balanced type and are supplied to the transistors Q322 and Q323.

Furthermore, the switching circuit 34Q is formed as a double balanced-type by the transistors Q341 to Q347. The local oscillation signal +SLQ of one of the phases is supplied to the transistors Q345 and Q346, and the local oscillation signal −SLQ of the other phases is supplied to the transistors Q344 and Q347. Also, the balanced-type control signal SSW is supplied to the transistors Q342 and Q343.

Then, based on the control signal SSW, when the transistor Q342 is on and the transistor Q343 is off, the transistors Q344 and Q345 are turned on, and the transistors Q346 and Q347 are turned off. Therefore, the local oscillation signal +SLQ is supplied to the transistors Q324 to Q327 via the transistor Q345 and further via the emitter-follower transistor Q349. Also, the local oscillation signal −SLQ is supplied to the transistors Q325 and Q326 via the transistor Q344 and further via the emitter-follower transistor Q348.

However, based on the control signal SSW, when the transistor Q343 is on and the transistor Q342 is off, the transistors Q346 and Q347 are turned on, and the transistors Q344 and Q345 are turned off. Therefore, the local oscillation signal +SLQ is supplied to the transistors Q325 and Q326 via the transistor Q346 and further via the transistor Q348. Also, the local oscillation signal −SLQ is supplied to the transistors Q324 and Q327 via the transistor Q347 and further via the transistor Q349.

Therefore, since the phase of the local oscillation signal SLQ supplied to the mixer circuit 32Q is made to lead or reversed in accordance with the control signal SSW, the intermediate frequency signal SIF of the ensemble A or the ensemble B is output from the addition circuit 38. Also in this case, since the phase of the local oscillation signal SLQ need only be inverted or non-inverted by the switching circuit 34Q, the ensemble can be switched quickly.

Many different embodiments of the present invention may be constructed without departing from the spirit and scope of the present invention. It should be understood that the present invention is not limited to the specific embodiments described in this specification. To the contrary, the present invention is intended to cover various modifications and equivalent arrangements included within the spirit and scope of the invention as hereafter claimed. The scope of the following claims is to be accorded the broadest interpretation so as to encompass all such modifications, equivalent structures and functions.

What is claimed is:

1. A receiving device comprising:
   a receiving circuit for receiving a first signal and a second signal transmitted at mutually different frequencies;
   a circuit for forming first and second local oscillation signals having frequencies at a center frequency between said first signal and said second signal and having phases that differ by 90° from each other;
   a first mixer circuit for frequency-converting a received signal received by said receiving circuit into a first intermediate frequency signal in accordance with said first local oscillation signal;
   a second mixer circuit for frequency-converting the received signal received by said receiving circuit into a second intermediate frequency signal in accordance with said second local oscillation signal;
   a first phase-shift circuit to which said first intermediate frequency signal is supplied;
   a second phase-shift circuit to which said second intermediate frequency signal is supplied, in which the amount of phase shift in said second phase-shift circuit differs by 90° from an amount of phase shift of said first phase-shift circuit; and
   an addition/subtraction circuit for switchably performing one of addition and subtraction between an output signal of said first phase-shift circuit and an output signal of said second phase-shift circuit,
   wherein, by switching said addition/subtraction circuit to perform addition or subtraction, the intermediate frequency signal corresponding to said first signal or the intermediate frequency signal corresponding to said second signal is selectively extracted from said addition/subtraction circuit.

2. A receiving device for receiving a multiplexed signal in which a first ensemble having signals of a first plurality of programs and a second ensemble having signals of a second plurality of programs are frequency-multiplexed and transmitted and for extracting from the multiplexed received signal one of the signals within said signals of the first plurality of programs and said signals of the second plurality of programs, said receiving device comprising:
   a circuit for forming first and second local oscillation signals having frequencies at a center frequency between said first ensemble and said second ensemble and having phases that differ by 90° from each other;
   a first mixer circuit for frequency-converting said received signal into a first intermediate frequency signal in accordance with said first local oscillation signal;
   a second mixer circuit for frequency-converting the received signal into a second intermediate frequency signal in accordance with said second local oscillation signal;
   a first phase-shift circuit to which said first intermediate frequency signal is supplied;
   a second phase-shift circuit to which said second intermediate frequency signal is supplied, in which the amount of phase shift in said second phase-shift circuit differs by 90° from an amount of phase-shift of said first phase-shift circuit; and
   an addition/subtraction circuit for switchably performing one of addition and subtraction between an output signal of said first phase-shift circuit and an output signal of said second phase-shift circuit,
   wherein, by switching said addition/subtraction circuit to perform addition or subtraction, the first intermediate frequency signal or the second intermediate frequency signal is selectively extracted from said addition/subtraction circuit.

3. The receiving device according to claim 2, further comprising:
   an intermediate frequency filter to which the output signal of said addition/subtraction circuit is supplied; and
   a demodulation circuit to which an output signal of the intermediate frequency filter is supplied,
   wherein, by switching said addition/subtraction circuit to perform addition or subtraction, the signals of said first plurality of programs or the signals of said second plurality of programs are selectively extracted from said demodulation circuit.

4. The receiving device according to claim 3, wherein, when each of said first ensemble and said second ensemble has a terrestrial-wave signal and a satellite-wave signal which are frequency-divided,
   said intermediate frequency filter comprises first and second intermediate frequency filters,
   said demodulation circuit comprises first and second demodulation circuits,
   the output signal of said addition/subtraction circuit is supplied to each of said first and second intermediate frequency filters, whereby the intermediate frequency signal of said terrestrial-wave signal and the intermediate frequency signal of said satellite-wave signal are extracted from said first and second intermediate frequency filters, and
   the intermediate frequency signals output from said first and second intermediate frequency filters are supplied to said first and second demodulation circuits, respectively.

5. A receiving device comprising:
   a receiving circuit for receiving a first signal and a second signal transmitted at mutually different frequencies;
   a circuit for forming first and second local oscillation signals having frequencies at a center frequency between said first signal and said second signal and having phases that differ by 90° from each other;
   a first mixer circuit for frequency-converting the received signal received by said receiving circuit into a first intermediate frequency signal in accordance with said first local oscillation signal;
   a second mixer circuit for frequency-converting the received signal received by said receiving circuit into a second intermediate frequency signal in accordance with said second local oscillation signal;
   a first phase-shift circuit to which said first intermediate frequency signal is supplied;
   a second phase-shift circuit to which said second intermediate frequency signal is supplied, in which the amount of phase shift in said second phase-shift circuit differs by 90° from an amount of phase shift of said first phase-shift circuit; and an addition circuit for performing addition of the output signal of said first phase-shift circuit and the output signal of said second phase-shift circuit; and a circuit for selectively inverting or non-inverting the phase of one of the output signal of said first phase-shift circuit and the output signal of said second phase-shift circuit supplied to said addition circuit, wherein, by switching between said inverting or said non-inverting, the intermediate frequency signal corresponding to said first signal or the intermediate frequency signal corresponding to said second signal is selectively extracted from said addition circuit.

6. The receiving device according to claim 5, wherein said circuit for selectively inverting or non-inverting is a circuit for inverting or non-inverting the phase of one of the signals of said first and second local oscillation signals.

7. The receiving device according to claim 5, wherein said circuit for selectively inverting or non-inverting is a circuit for inverting or non-inverting the phase of one of the signals of said first and second intermediate frequency signals.

8. A receiving device for receiving a multiplexed signal in which a first ensemble having signals of a first plurality of programs and a second ensemble having signals of a second plurality of programs are frequency-multiplexed and transmitted and for extracting from the multiplexed received signal one of the signals within said signals of the first plurality of programs and said signals of the second plurality of programs, said receiving device comprising:

a circuit for forming first and second local oscillation signals having frequencies at a center frequency between said first ensemble and said second ensemble and having phases that differ by 90° from each other;

a first mixer circuit for frequency-converting the received signal into a first intermediate frequency signal in accordance with said first local oscillation signal;

a second mixer circuit for frequency-converting the received signal into a second intermediate frequency signal in accordance with said second local oscillation signal;

a first phase-shift circuit to which said first intermediate frequency signal is supplied;

a second phase-shift circuit to which said second intermediate frequency signal is supplied, in which an amount of in said second phase-shift circuit phase shift differs by 90° from an amount of phase shift of said first phase-shift circuit;

an addition circuit for performing addition of the output signal of said first phase-shift circuit and the output signal of said second phase-shift circuit; and a circuit for selectively inverting or non-inverting the phase of one of said first and second intermediate frequency signals, wherein, by switching between said inverting or said non-inverting, the intermediate frequency signal corresponding to said first signal or the intermediate frequency signal corresponding to said second signal is selectively extracted from said addition circuit.

9. The receiving device according to claim 8, further comprising:

an intermediate frequency filter to which the output signal of said addition circuit is supplied; and a demodulation circuit to which an output signal of the intermediate frequency filter is supplied, wherein, by switching between said inverting or said non-inverting, the signals of said first plurality of programs or the signals of said second plurality of programs are selectively extracted from said demodulation circuit.

10. The receiving device according to claim 9, wherein, when each of said first ensemble and said second ensemble has a terrestrial-wave signal and a satellite-wave signal which are frequency-divided, said intermediate frequency filter comprises first and second intermediate frequency filters, said demodulation circuit comprises first and second demodulation circuits, the output signal of said addition circuit is supplied to each of said first and second intermediate frequency filters, whereby the intermediate frequency signal of said terrestrial-wave signal and the intermediate frequency signal of said satellite-wave signal are extracted from said first and second intermediate frequency filters, and the intermediate frequency signals output from said first and second intermediate frequency filters are supplied to said first and second demodulation circuits, respectively.

11. The receiving device according to claim 10, further comprising a selecting/combining circuit for selecting or combining the demodulated outputs of said first and second demodulation circuits and for outputting the demodulated outputs.

12. The receiving device according to claim 8, wherein said circuit for selectively inverting or non-inverting is a circuit for inverting or non-inverting the phase of one of the signals of said first and second local oscillation signals.

13. The receiving device according to claim 8, wherein said circuit for selectively inverting or non-inverting is a circuit for inverting or non-inverting the phase of one of the signals of said first and second intermediate frequency signals.

14. An integrated circuit for reception comprising:

a high-frequency amplifier for receiving a first signal and a second signal transmitted at mutually different frequencies;

a circuit for forming first and second local oscillation signals having frequencies at a center frequency between said first signal and said second signal, and having phases that differ by 90° from each other;

a first mixer circuit for frequency-converting the received signal received by said high-frequency amplifier into a first intermediate frequency signal in accordance with said first local oscillation signal;

a second mixer circuit for frequency-converting the received signal received by said high-frequency amplifier into a second intermediate frequency signal in accordance with said second local oscillation signal;

a first phase-shift circuit to which said first intermediate frequency signal is supplied;

a second phase-shift circuit to which said second intermediate frequency signal is supplied, in which an amount of phase shift in said second phase-shift circuit differs by 90° from an amount of phase-shift of said first phase-shift circuit; and an addition/subtraction circuit for switchably performing one of addition and subtraction between an output signal of said first phase-shift circuit and an output signal of said second phase-shift circuit, which are integrated into one chip, wherein, by switching said addition/subtraction circuit to perform addition or subtraction, the intermediate frequency signal corresponding to said first signal or the intermediate frequency signal corresponding to said second signal is selectively extracted from said addition/subtraction circuit.

15. A reception integrated circuit for receiving a multiplexed signal in which a first ensemble having signals of a first plurality of programs and a second ensemble having signals of a second plurality of programs are frequency-multiplexed and transmitted and for extracting from the multiplexed received signal one of the signals within the signals of said first plurality of programs and the signals of said second plurality of programs, said reception integrated circuit comprising:

a circuit for forming first and second local oscillation signals having frequencies at a center frequency between said first ensemble and said second ensemble and having phases that differ by 90° from each other;

a first mixer circuit for frequency-converting the received signal into a first intermediate frequency signal in accordance with said first local oscillation signal;

a second mixer circuit for frequency-converting the received signal into a second intermediate frequency signal in accordance with said second local oscillation signal;

a first phase-shift circuit to which said first intermediate frequency signal is supplied;

a second phase-shift circuit to which said second intermediate frequency signal is supplied, in which an amount of phase shift in said second phase-shift circuit differs by 90° from that an amount of phase shift of said first phase-shift circuit;

an addition/subtraction circuit for switchably performing one of addition and subtraction between the output signal of said first phase-shift circuit and the output signal of said second phase-shift circuit;

an intermediate frequency filter to which an output signal of the addition/subtraction circuit is supplied; and a demodulation circuit to which an output signal of the intermediate frequency filter is supplied, wherein, by switching said addition/subtraction circuit to perform addition or subtraction, the signals of said first plurality of programs or the signals of said second plurality of programs are selectively extracted from said demodulation circuit.

16. A reception integrated circuit comprising:

a high-frequency amplifier for receiving a first signal and a second signal transmitted at mutually different frequencies;

a circuit for forming first and second local oscillation signals having frequencies at a center frequency between said first signal and said second signal, and having phases that differ by 90° from each other;

a first mixer circuit for frequency-converting the received signal received by said high-frequency amplifier into a first intermediate frequency signal in accordance with said first local oscillation signal;

a second mixer circuit for frequency-converting the received signal received by said high-frequency amplifier into a second intermediate frequency signal in accordance with said second local oscillation signal;

a first phase-shift circuit to which said first intermediate frequency signal is supplied;

a second phase-shift circuit to which said second intermediate frequency signal is supplied, in which an amount of phase shift in said second phase-shift circuit differs by 90° from an amount of phase-shift of said first phase-shift circuit;

an addition circuit for performing addition of the output signal of said first phase-shift circuit and the output signal of said second phase-shift circuit; and a circuit for switchably inverting or non-inverting the phase of one of the output signal of said first phase-shift circuit and the output signal of said second phase-shift circuit supplied to said addition circuit, which are integrated into one chip, wherein, by switching between said inverting or said non-inverting, the intermediate frequency signal corresponding to said first signal or the intermediate frequency signal corresponding to said second signal is selectively extracted from said addition circuit.

17. A reception integrated circuit for receiving a multiplexed signal in which a first ensemble having signals of a first plurality of programs and a second ensemble having signals of a second plurality of programs are frequency-multiplexed and transmitted and for extracting from the multiplexed received signal one of the signals within the signals of said first plurality of programs and the signals of said second plurality of programs, said reception integrated circuit comprising:

a circuit for forming first and second local oscillation signals having frequencies at a center frequency between said first ensemble and said second ensemble and having phases that differ by 90° from each other;

a first mixer circuit for frequency converting the received signal into a first intermediate frequency signal in accordance with said first local oscillation signal;

a second mixer circuit for frequency-converting the received signal into a second intermediate frequency signal in accordance with said second local oscillation signal;

a first phase-shift circuit to which said first intermediate frequency signal is supplied;

a second phase-shift circuit to which said second intermediate frequency signal is supplied, in which an amount of phase shift in said second phase-shift circuit differs by 90° from an amount of phase-shift of said first phase-shift circuit;

an addition circuit for performing addition of an output signal of said first phase-shift circuit and an output signal of said second phase-shift circuit;

an intermediate frequency filter to which an output signal of the addition circuit is supplied;

a demodulation circuit to which the output signal of an intermediate frequency filter is supplied; and a circuit for selectively inverting or non-inverting the phase of one of the output signal of said first phase-shift circuit and the output signal of said second phase-shift circuit supplied to said addition circuit, which are integrated into one chip, wherein, by switching between said inverting or said non-inverting, the signals of said first plurality of programs and the signals of said second plurality of programs are selectively extracted from said demodulation circuit.

* * * * *